US010075789B2

(12) United States Patent
Stein et al.

(10) Patent No.: US 10,075,789 B2
(45) Date of Patent: Sep. 11, 2018

(54) GAIN PHASE EQUALIZATION (GPEQ) FILTER AND TUNING METHODS FOR ASYMMETRIC TRANSAURAL AUDIO REPRODUCTION

(71) Applicant: DTS, Inc., Calabasas, CA (US)

(72) Inventors: Edward Stein, Aptos, CA (US); David Corsello, Redwood City, CA (US); Guangji Shi, San Jose, CA (US)

(73) Assignee: DTS, Inc., Calabasas, CA (US)

( * ) Notice: Subject to any disclaimer, the term of this patent is extended or adjusted under 35 U.S.C. 154(b) by 0 days.

(21) Appl. No.: 15/290,392

(22) Filed: Oct. 11, 2016

(65) Prior Publication Data

US 2018/0103319 A1    Apr. 12, 2018

(51) Int. Cl.
| | | |
|---|---|---|
| H03G 5/00 | (2006.01) | |
| H04R 3/04 | (2006.01) | |
| H04R 29/00 | (2006.01) | |
| H04R 3/14 | (2006.01) | |
| H03G 3/30 | (2006.01) | |

(52) U.S. Cl.
CPC ............. H04R 3/04 (2013.01); H03G 3/301 (2013.01); H03G 3/3089 (2013.01); H04R 3/14 (2013.01); H04R 29/001 (2013.01)

(58) Field of Classification Search
CPC ........ H04S 2420/01; H04S 1/00; H04S 1/002; H04S 1/007; H04S 3/00; H04S 3/002; H04S 3/008; H04S 3/02; H04S 7/00; H04S 7/30; H04S 7/301; H04S 7/302; H04S 7/303; H04S 7/305; H04S 7/307; H04S 7/40
USPC ....................... 381/97, 98, 99, 101, 102, 103
See application file for complete search history.

(56) References Cited

U.S. PATENT DOCUMENTS

| | | | |
|---|---|---|---|
| 6,674,864 B1 | 1/2004 | Kitamura | |
| 8,280,076 B2 * | 10/2012 | Devantier | H04S 7/302 |
| | | | 381/103 |
| 8,306,231 B2 | 11/2012 | Gustavsson et al. | |

(Continued)

FOREIGN PATENT DOCUMENTS

WO     WO2012145828     11/2012

OTHER PUBLICATIONS

Toshiya, Robust transaural sound reproduction, 2010.*

(Continued)

*Primary Examiner* — William A Jerez Lora
(74) *Attorney, Agent, or Firm* — Craig Fischer

(57) ABSTRACT

A GPEQ filter and tuning methods for asymmetric transaural audio reproduction on mobile consumer devices. The GPEQ filter includes an asymmetric FIR filter bank configured to normalize the magnitude responses of at least two audio speakers to a target response above a low frequency cross-over of the audio speakers as reproduced at the listener position and a symmetric IIR filter bank component configured to high pass filter above the low frequency cross-over and equalize the magnitude responses of the at least two audio speakers. In some embodiments the FIR filter bank is configured to normalize the group delay of the audio channels and in some embodiments the IIR filter bank includes an asymmetric IIR filter bank component configured to correct any residual asymmetry in the magnitude responses of the at least two audio speakers. Phase preservation may be accomplished using phase-balanced or phase-compensated IIR filter sections.

23 Claims, 16 Drawing Sheets

(56) References Cited

U.S. PATENT DOCUMENTS

| | | | |
|---|---|---|---|
| 8,761,407 B2 | 6/2014 | Brown et al. | |
| 2008/0049948 A1* | 2/2008 | Christoph | H04S 7/301 |
| | | | 381/86 |
| 2011/0150241 A1* | 6/2011 | Christoph | H04S 7/301 |
| | | | 381/103 |

OTHER PUBLICATIONS

Gerson, non-integer number of period, 2008.*
Novero, WO2012/145828, 2012.*
International Search Report in Corresponding PCT Application No. PCT/US2017/55892, filed Oct. 10, 2017.
Toshiya Samejima "Robust transaural sound reproduction system based on feedback control," Jan. 6, 2010.
Gerson "Mean and RMS Calculations for Sampled Periodic Signals With Non-Integer Number of Sampes Per Period Applied to AC Energy Systems" 2008.

* cited by examiner

GAIN PHASE EQUALIZATION (GPEQ) FILTER AND TUNING METHODS FOR ASYMMETRIC TRANSAURAL AUDIO REPRODUCTION

BACKGROUND

Field of the Invention

This invention relates to transaural audio reproduction, and more particularly to a Gain Phase Equalization (GPEQ) filter and tuning methods for asymmetric transaural audio reproduction on laptops, tablets, and other small or portable audio devices, speaker systems or for asymmetrical binaural reproduction on headphones.

Description of the Related Art

In sound recording and audio reproduction, equalization ("EQ") is the process commonly used to alter the frequency response of individual audio channels using linear filters to adjust the balance between frequency components. The linear filters boost or cut the energy of specific frequency bands. EQ can be used to provide speaker protection by removing low frequency content below a speaker's crossover frequency Fc and to provide overall tonal control.

An equalizer is the piece of equipment used to achieve EQ. Graphic equalizers allow the sound technician or field application engineer to boost or cut the amplitude at a number of center frequencies using a vertical slider for each band. Parameter equalizers ("PEQ") allow the sound technician or field application engineer to control amplitude, center frequency and bandwidth for each band. Parametric equalizers are capable of making much more precise adjustments to sound than graphic equalizers, but require more expertise in tuning. In an exemplary design, each PEQ band corresponds to a different $2^{nd}$ order IIR (Infinite Impulse Response) filter section. The user manually adjusts the filter type, amplitude, center frequency and bandwidth for each band when applicable, which is then converted into coefficients for the $2^{nd}$ order IIR filter section. Multiple bands of various filter types can be cascaded to form an overall EQ response. Examples of such filter design methods are discussed in the Audio EQ Cookbook by Robert Bristow-Johnson, web published at www.musicdsp.org/files/Audio-EQ-Cookbook.txt.

Stereo audio is a method of sound reproduction that creates an illusion of multi-directional audible perspective. This is achieved using two independent audio channels through a configuration of two audio speakers in such a way as to create the impression of sound heard from various directions bound by the placement of the speakers. Multichannel or "surround" audio adds additional channels and speakers so as to fully surround the listener (removing the bounds in which sounds may be heard), however such systems are not practical or portable. Binaural audio is a method of sound reproduction that creates a full 3-D surround sound sensation for the listener using two channels specifically designed for reproduction at the listeners ears. Binaural and stereo audio are often confused. Stereo speaker playback does not factor in the natural ear spacing or other morphologies of the listener and because stereo speaker crosstalk interferes with binaural reproduction, either headphones are required, or a crosstalk cancellation (CTC) filter is required to pre-condition the audio channel to produce transaural audio signals for reproduction via audio speakers at the listener position which do account for these factors. The process for which has been described and improved in multiple inventions. An early such example is "Apparent Sound Source Translator" by Atal and Schroeder U.S. Pat. No. 3,236,949. As will be discussed throughout this patent, EQ and specifically PEQ can be applied to stereo, binaural and transaural audio signals, but some care is required to ensure that it does not interact with listener factors and morphology accounted for by the transaural or binaural audio signals.

In many audio systems, the speaker configuration is, or is assumed to be, symmetric with respect to the listener position. Symmetric in both the magnitude response of the speaker (e.g., all of the speakers are the same) and the group delay and phase response (e.g., all of the speakers are positioned equidistant to the listener position.) In these systems, PEQ is applied symmetrically to all channels.

In certain audio systems, such as laptops, tablets, certain headphones and other small or portable audio devices or speaker systems the speaker configuration is asymmetric in either magnitude response and/or group delay and phase response. For example, in a laptop computer physically different speakers may be positioned in various locations to accommodate other packaging constraints. In these systems, EQ or PEQ must be applied asymmetrically to the channels to compensate for the magnitude asymmetry as well as perform the EQ. Group delay compensation can be used to compensate for the asymmetric positioning.

A problem is that the 2nd order IIR filter sections traditionally used in asymmetric PEQ do not preserve the relative phase of the audio signals. For traditional stereo audio, this may affect the "stereo imaging" but for low cost, mobile devices it is typically acceptable. However, for binaural and particularly transaural audio signals the loss of phase preservation is devastating. The magnitude and timing of signals to be subtracted by the CTC filter is lost. The result may actually be a boost in crosstalk.

Standard CTC filters assume symmetric reproduction at the listener position. Some approaches have been proposed to incorporate the asymmetry correction into the CTC filter itself. See for example U.S. Pat. No. 8,050,433. The drawback to this approach is that it does not address asymmetric magnitude response and if it did would couple the spatial audio design to the subjective equalization of the device (two things typically treated independently at different times of the design process and usually by different teams or even companies). Even if the coupling is acceptable, asymmetric equalization creates a frequency dependent phase response not easily compensated for with the simple delays of typical crosstalk canceling designs.

The current state of the art for transaural audio is to choose. Either conventional PEQ is applied and the 3-D spatial nature of the audio is lost or EQ is not applied. As transaural audio continues to penetrate the market for asymmetric audio devices this is not an acceptable condition.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Embodiments of the GPEQ filter described herein provide a modular solution (independent of the CTC filter) and method of tuning the filter to pre-condition transaural audio signals carried in respective audio channels to remove asymmetry (magnitude and/or group delay/phase response) of the audio speakers for transaural reproduction at a listener position while preserving the PEQ function. The GPEQ filter provides the requisite high frequency sensitivity for precise asymmetric magnitude correction. The GPEQ filter is relatively inexpensive to implement (e.g., low order or # of filter taps) and to tune (e.g., a largely automated process).

Embodiments of the GPEQ filter comprise an asymmetric FIR filter bank and an IIR filter bank. The asymmetric FIR filter bank is configured to normalize the magnitude responses of the at least two audio speakers to a target response above a low frequency cross-over Fc of the audio speakers as reproduced at the listener position. The target response may include an average magnitude response of the at least two audio speakers. The asymmetric FIR filter bank may be configured to include a delay, possibly non-integer, to normalize group delay and the phase responses of the at least two audio speakers at the listener position. The IIR filter bank includes a symmetric IIR filter bank component configured to high pass filter above the low frequency cross-over Fc and equalize the magnitude responses of the at least two audio speakers. The IIR filter bank may further include an asymmetric IIR filter bank component configured to correct residual asymmetry in the magnitude responses of the at least two audio speakers near the low-frequency cross-over Fc (e.g., equating the magnitude responses at Fc) while preserving the relative phases of the at least two transaural audio signals. Phase preservation may be accomplished using phase-balanced or phase-compensated IIR filter sections. The FIR and IIR filters are linear time invariant filters so the order of implementation does not matter.

Embodiments of the GPEQ filter may include an N-tap FIR filter bank of which M<=N taps are asymmetrically configured with coefficients for a particular audio device and an IIR filter bank including X IIR filter sections of which Y sections are symmetrically configured with coefficients for the audio device and Z sections are asymmetrically configured with coefficients for the audio device where Y+Z<=X. In this manner, the architecture and hardware to implement the GPEQ filter is universal to the class of audio devices. All that changes are the coefficients that are loaded into the GPEQ filter for a particular device.

Embodiments of an audio device for transaural audio rendering at a listener position comprise a spatial audio processor configured to generate a plurality of binaural audio signals in respective audio channels, a crosstalk cancellation (CTC) filter configured to pre-condition the binaural audio signals to negate acoustical crosstalk and output a plurality of transaural audio signals in the respective audio channels, a gain phase equalization (GPEQ) filter configured to pre-condition the at least two transaural audio signals to perform speaker protection and PEQ and to remove any asymmetries due to the audio speakers and a plurality of audio speakers configured to render the plurality of transaural audio signals at the listener position.

Embodiments of a method of tuning a GPEQ filter comprise determining a low-frequency cross-over Fc of the audio speakers, tuning an asymmetric FIR filter bank to normalize the magnitude responses of the at least two audio speakers to a target response above the low-frequency cross-over Fc, configuring a delay to normalize the time-of-arrival (TOA) or "group delay" of the at least two transaural audio signals at the listener position, manually performing a parametric equalization (PEQ) process to configure a symmetric IIR filter bank component to high pass filter above the low frequency cross-over Fc and equalize the magnitude responses of the at least two audio speakers, optionally manually performing an asymmetric PEQ process to configure an asymmetric IIR filter bank component to correct residual asymmetry near Fc while preserving the relative phase and storing the coefficients for the asymmetric FIR filter bank and the IIR filter bank components.

It should be noted that alternative embodiments are possible, and steps and elements discussed herein may be changed, added, or eliminated, depending on the particular embodiment. These alternative embodiments include alternative steps and alternative elements that may be used, and structural changes that may be made, without departing from the scope of the invention.

DRAWINGS DESCRIPTION

Referring now to the drawings in which like reference numbers represent corresponding parts throughout:

Figure 4:
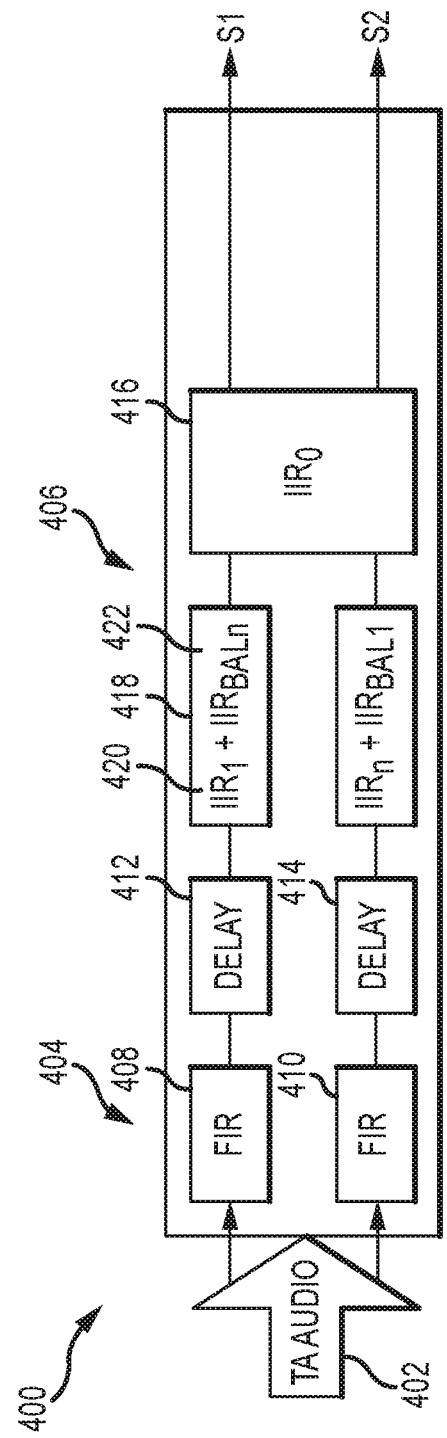
Figure 6:
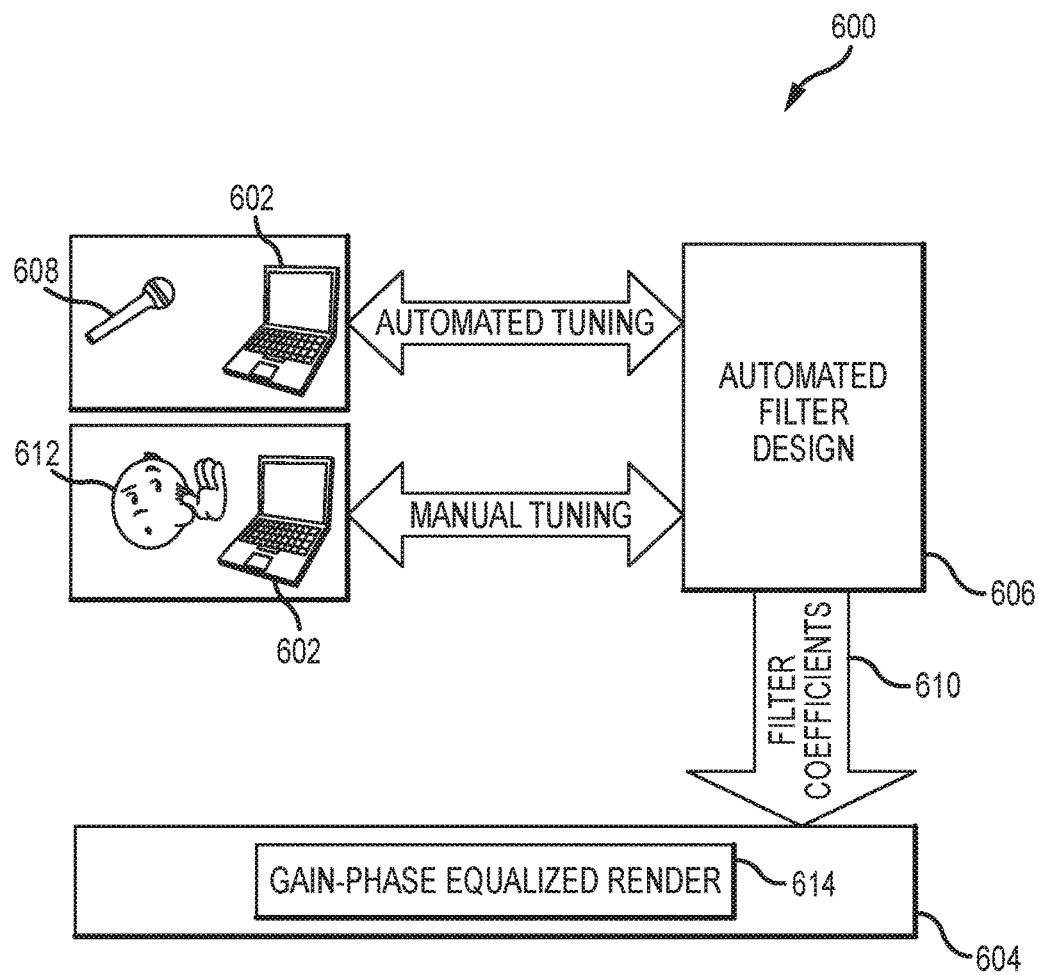
Figure 7:
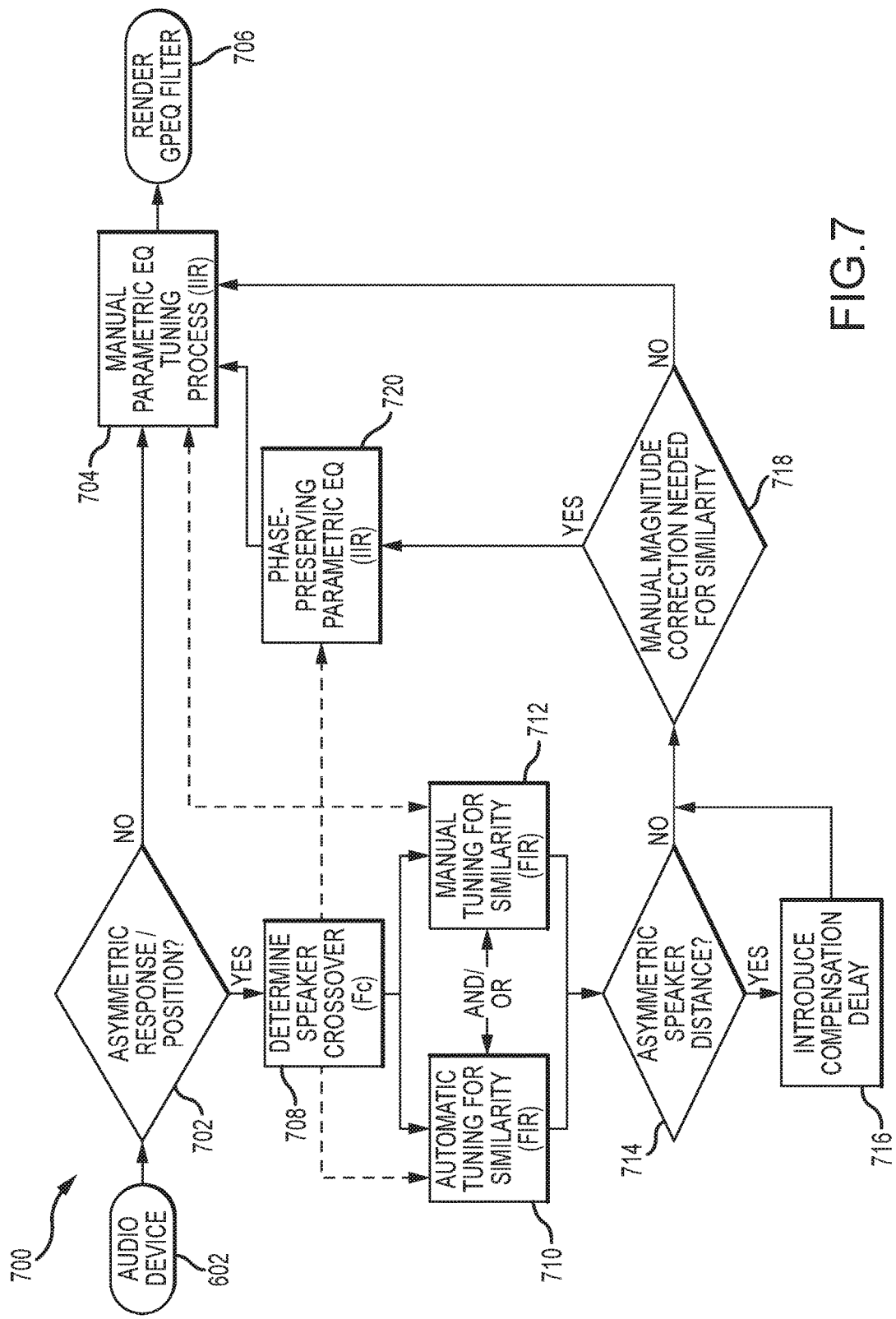
Figure 8:
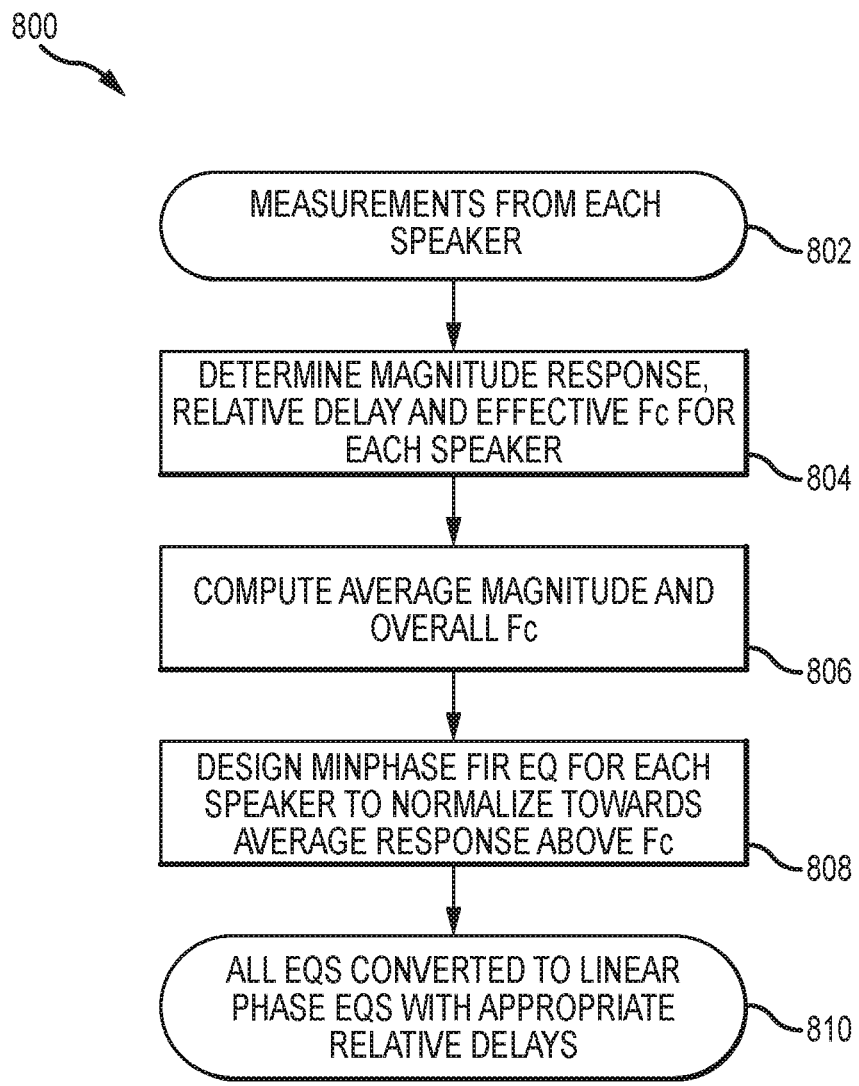
Figure 9:
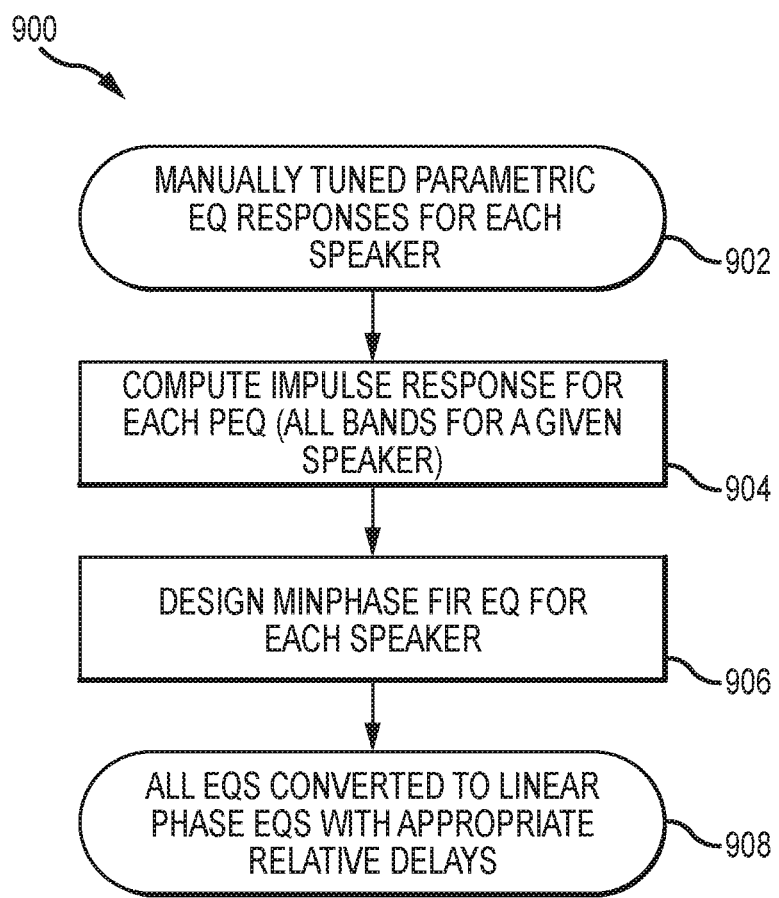
Figure 10A:
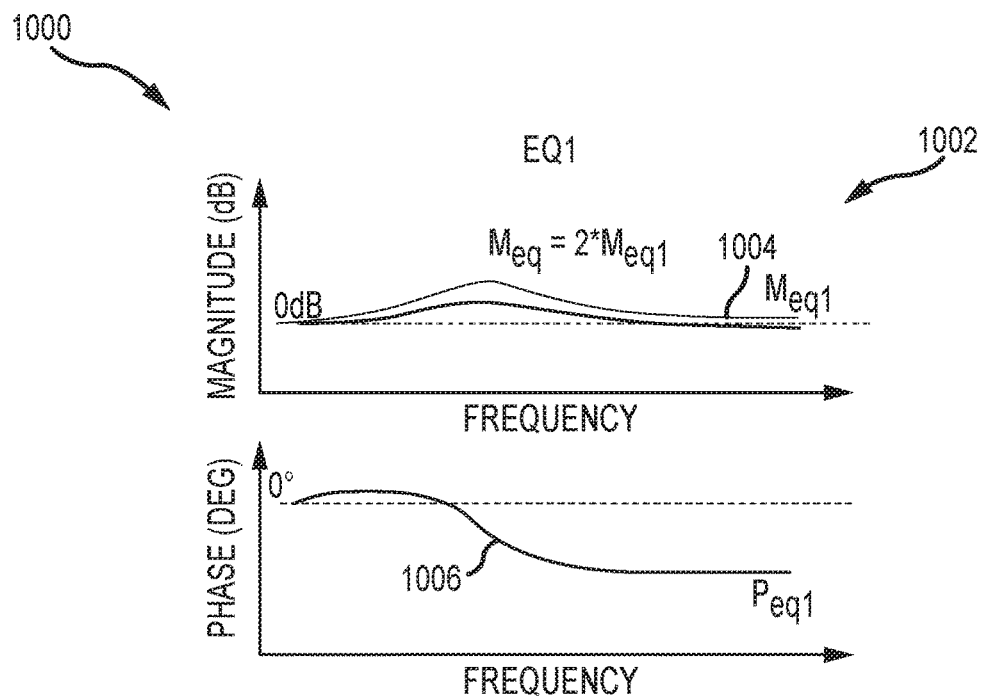
Figure 10B:
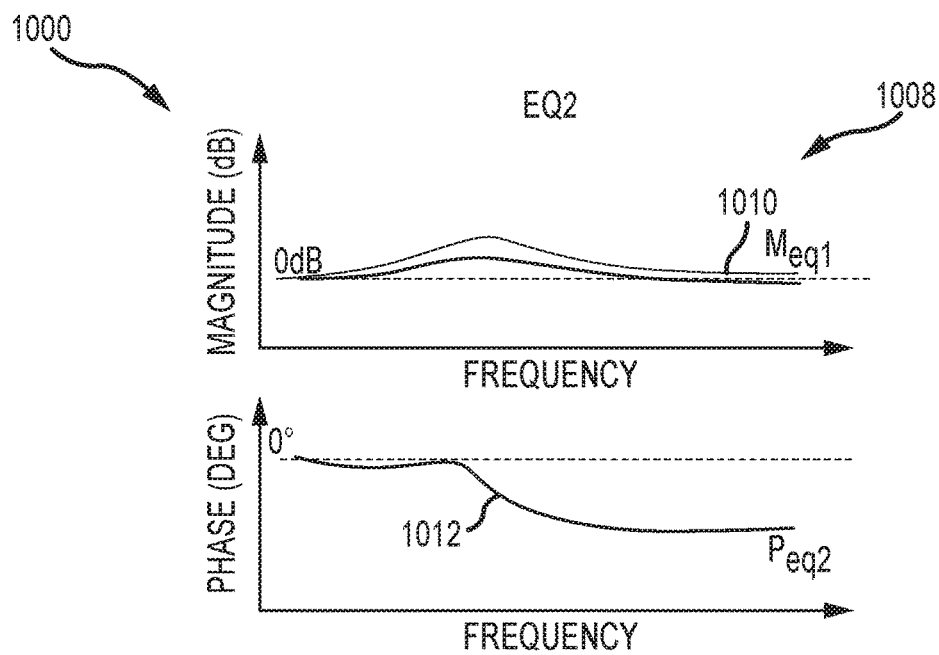
Figure 10C:
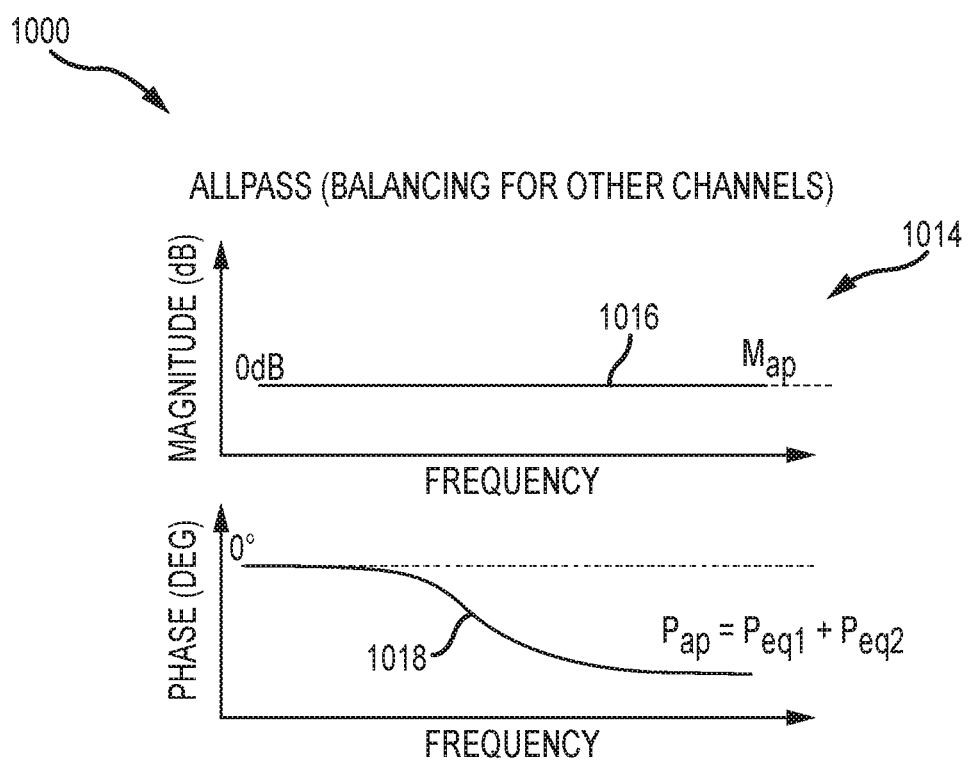
Figure 11A:
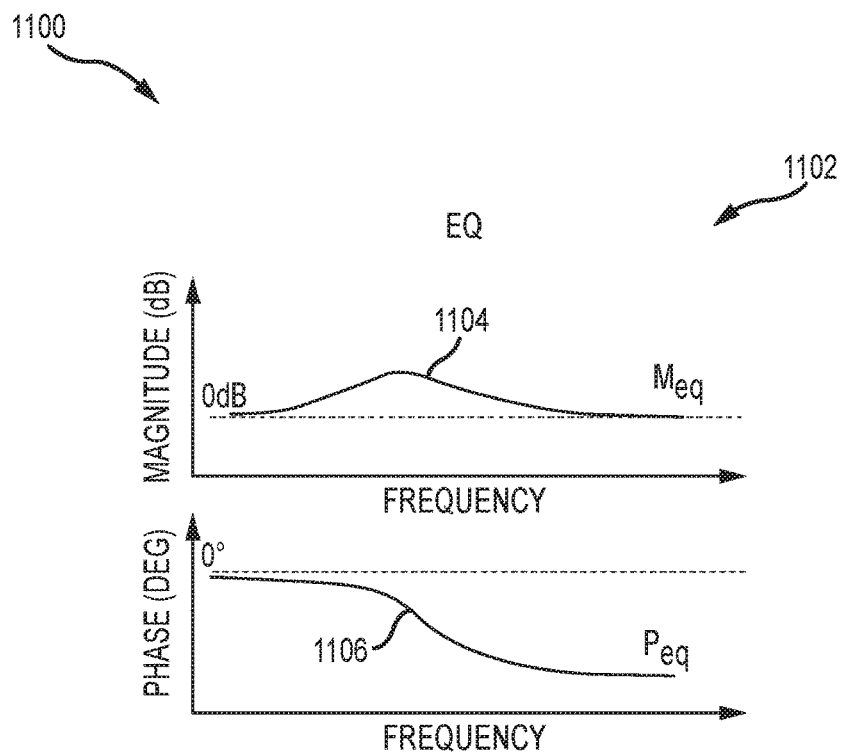
Figure 11B:
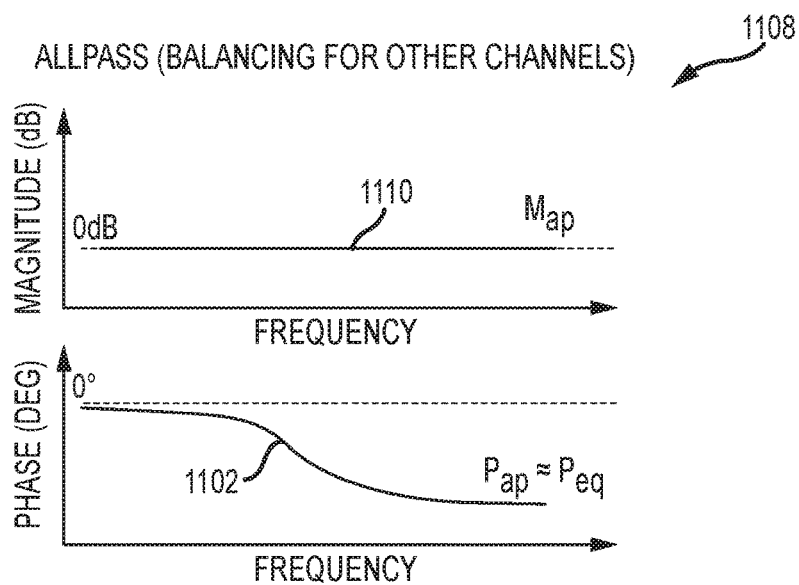

FIG. 4 is a block diagram of an embodiment of a GPEQ filter including an asymmetric FIR filter bank and delay configured to remove asymmetry above a low-frequency cross-over Fc of the audio speakers, an optional asymmetric IIR filter bank configured to remove residual asymmetry near the low-frequency cross-over Fc and a symmetric IIR filter bank configured to high pass filter above the low-frequency cross-over FC and EQ the magnitude responses of the audio speakers;

FIGS. 5a through 5h are plots of the raw speaker responses, filter responses and modified speaker responses for the asymmetric FIR, asymmetric IIR and symmetric IIR, and overall GPEQ filter response;

FIGS. 6 and 7 are a block diagram and flow diagram for an embodiment of a method for tuning a GPEQ for asymmetric transaural audio reproduction;

FIG. 8 is a flow diagram of an embodiment for automated tuning of the asymmetric FIR filterbank;

FIG. 9 is a flow diagram of an embodiment for manual tuning of the asymmetric FIR filterbank;

FIGS. 10a-10c depict an embodiment of a phase-balanced asymmetric IIR filter; and FIGS. 11a-11b depict an embodiment of a phase-compensated asymmetric IIR filter.

DETAILED DESCRIPTION

In the following description of embodiments of a GPEQ filter and tuning methods for asymmetric transaural audio reproduction reference is made to the accompanying drawings. These drawings shown by way of illustration specific examples of how embodiments of the GPEQ filter and tuning methods may be practiced. It is understood that other embodiments may be utilized and structural changes may be made without departing from the scope of the claimed subject matter.

An object of the present invention is to provide a modular solution (independent of the CTC filter) and method of tuning the filter to remove asymmetry (magnitude and/or group delay/phase response) while preserving the PEQ function. The filter should provide the requisite high frequency sensitivity for precise asymmetry magnitude correction. The modular filter should be relatively inexpensive to implement (e.g., low order or # of filter taps) and to tune (e.g., a largely automated process).

An approach would be to replace the $2^{nd}$ order IIR filter sections with $2^{nd}$ order phase-balanced IIR filters (Peter Eastty, "Balanced Phase Equalization; IIR Filters with Independent Frequency Response and Identical Phase Response" AES Convention October 2012). These phase-balanced IIR filters do preserve the relative phase of the transaural audio signals, and thus could accurately reproduce the transaural audio signals at the listener position. Group delay compensation can be implemented to remove the position asymmetry. However, the use of asymmetric PEQ to remove the magnitude asymmetry would have several drawbacks. Unlike EQ, manually tuning the IIR filter sections to precisely remove the asymmetries would require many hours of tedious labor. IIR filters do not readily provide the high frequency resolution to remove complex asymmetries. High order (expensive) IIR filters would be required to approximate such performance. The cost to both implement and tune the asymmetric phase-balanced IIR filters disqualifies this approach.

Another approach would be to completely replace the IIR filters used in PEQ with an asymmetric FIR (Finite Impulse Response) filter bank to provide both the speaker protection and EQ as well as to remove both the magnitude and group delay/phase response asymmetries. Tuning of the FIR filter bank may be fully automated. However, the length (# of taps) of the FIR filter required to perform all of these functions is prohibitive. Implementation of such an FIR filter would be too expensive for small or mobile devices such as laptops, tablets, and phones or headphones. Furthermore, the ability to have manual control over tonal features is lost.

In accordance with the present invention, a modular solution that is both relatively inexpensive to implement and tune, provides the requisite capability to precisely remove asymmetries and preserves the standard PEQ is based on a hybrid filter architecture referred to as a Gain Phase Equalization (GPEQ) filter. The GPEQ filter follows the CTC filter to pre-condition the transaural audio signals in the respective audio channels to remove asymmetries attributable to the audio speakers.

The GPEQ filter includes both an asymmetric FIR filter bank and an IIR filter bank. The FIR filter bank is configured to normalize the magnitude responses of at least two audio speakers (e.g., L and R or multi-channel) to a target response above a low frequency cross-over Fc of the audio speakers as reproduced at the listener position. If needed, the group delay of the audio speakers is normalized via discrete delays or incorporated into the FIR filter bank. The IIR filter bank includes a symmetric IIR filter bank component configured to high pass filter above the low frequency cross-over Fc and equalize the magnitude responses of the at least two audio speakers. This component performs PEQ on the target response. The IIR filter bank may also include an asymmetric IIR filter bank component configured to correct any residual asymmetry in the magnitude responses of the at least two audio speakers near the low-frequency cross-over Fc while preserving the relative phases of the at least two transaural audio signals. Phase preservation may be accomplished using phase-balanced or phase-compensated IIR filter sections. The FIR and IIR filters are linear time invariant filters so the order of implementation does not matter. The FIR filter bank may be automatically tuned whereas the symmetric and asymmetric IIR filter sections are manually tuned. The filters are tuned in order of the FIR filter, asymmetric IIR and finally the symmetric IIR to perform PEQ.

The GPEQ filter provides a modular solution independent of the CTC filter and which facilitates use of a symmetric CTC filter. The hybrid nature of the GPEQ filter makes it inexpensive to implement and tune. The FIR filter bank has relatively few taps because it is limited to processing audio content above the low-frequency cross-over Fc and, in certain embodiments, normalizes the magnitude response to an average magnitude response. The FIR filter provides good high frequency asymmetry correction and can be tuned automatically. The IIR filter banks are low order because they are limited to performing standard PEQ and to removing only a few (if any) residual asymmetries near Fc. This type of manual tuning is manageable.

Figure 1A:
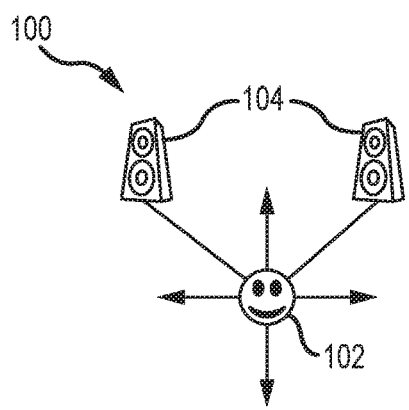
FIGS. 1a, 1b and 1c are diagrams of a symmetric audio device, an asymmetric audio device, and the asymmetric audio device with Gain Phase Equalization, respectively.
Figure 1B:
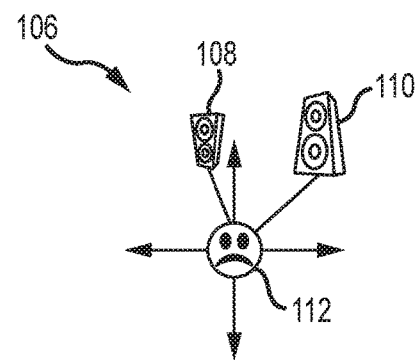
Figure 1C:
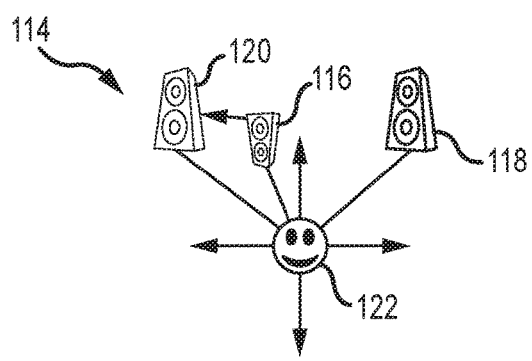

Referring now to FIG. 1a, all spatial audio technologies (e.g., stereo, binaural, transaural (L/R or multi-channel)) require that an audio device 100 exhibit symmetry of both the placement relative to listener position 102 and magnitude response of audio speakers 104. These requirements are rarely achieved by mobile consumer devices 106 (e.g., phones, tablets, laptops, portable games) that have different audio speakers 108 and 110 (with different magnitude responses) positioned asymmetrically relative to listener position 112 as shown in FIG. 2a. As previously discussed, such asymmetry can have devastating effects on the 3-D spatial nature of transaural audio as reproduced at the listener position if traditional asymmetric PEQ is applied. As shown in FIG. 1c, the use of a GPEQ filter downstream of the CTC filter to pre-condition the transaural audio signals in the respective audio channels of a mobile consumer device 114 having asymmetric speakers 116 and 118 removes the magnitude and group delay/phase response asymmetries to produce an apparently symmetric pair of speakers 120 and 118 to reproduce the transaural audio at the listener position 122.

Figure 2:
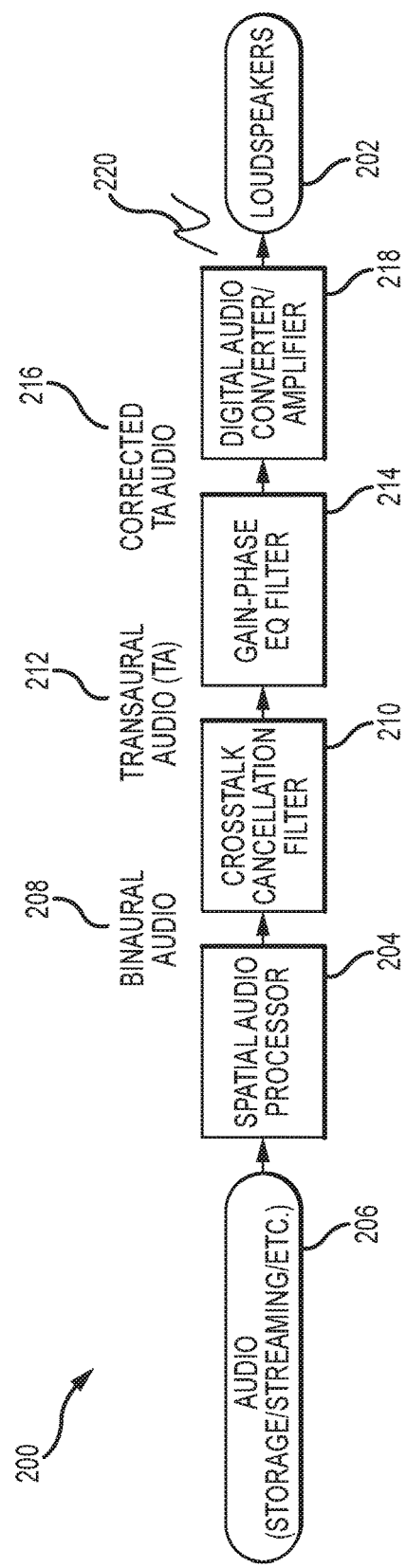
FIG. 2 is a block diagram of an embodiment of an asymmetric audio device including a GPEQ filter for pre-conditioning the transaural audio signals in respective audio channels to remove speaker asymmetry.

Referring now to FIG. 2, an embodiment of an audio device 200 comprises at least two audio speakers 202 that exhibit an asymmetric magnitude response and asymmetric positions relative to an expected listener position. A spatial audio processor 204 is configured to receive and process audio 206 (storage/streaming/etc.) to generate binaural audio signals 208 in respective audio channels. A crosstalk cancellation (CTC) filter 210 is configured to pre-condition the binaural audio signals to generate at least two transaural audio signals 212 in the respective audio channels on the assumption that the speakers' magnitude responses and positions are symmetric. A GPEQ filter 214 is configured to pre-condition the transaural audio signals 212 to generate corrected transaural audio signals 216 for transaural reproduction at a listener position corrected for the asymmetric speakers. The GPEQ filter must be after the CTC because it is the CTC which introduces anti-crosstalk from each channel to the other channels. If the GPEQ was before the CTC, the asymmetric parts of the equalization and the delay would be introduced in part to the wrong signals. Signals 216 are fed to a digital audio converter/amplifier 218 that convert the digital signals to analog signals 220 to drive audio speakers 202.

DTS, Inc., the assignee of this technology, has deployed binaural/transaural technologies such as Headphone: X® on laptops, tablets and other small or portable devices. The GPEQ filter will be integrated with these and other binaural/transaural technologies.

Figure 3A:
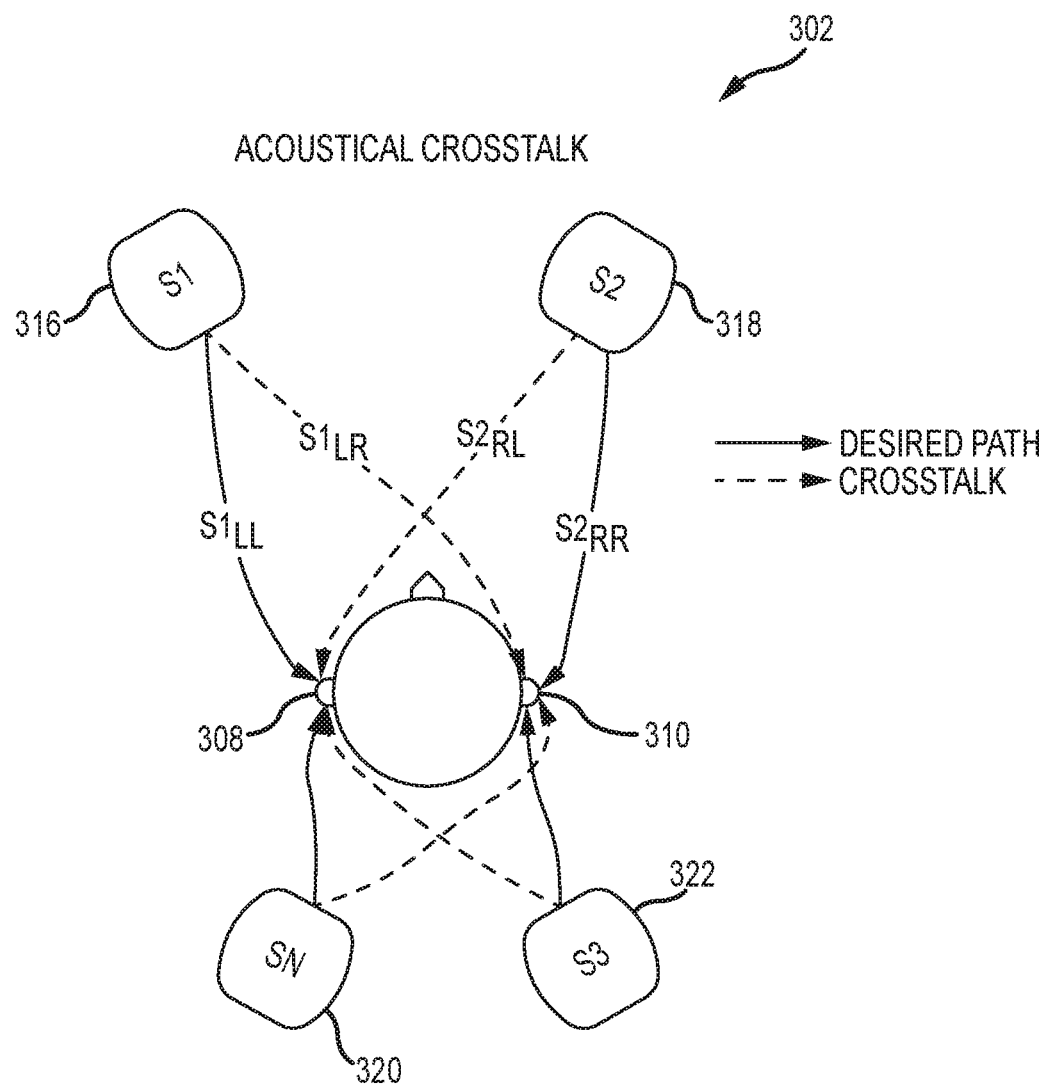
FIGS. 3a and 3b are diagrams of acoustic crosstalk at a listener position and a crosstalk cancellation processing for producing transaural audio signals for transaural reproduction at a listener position assuming symmetrical magnitude response and positioning of the audio speakers.
Figure 3B:
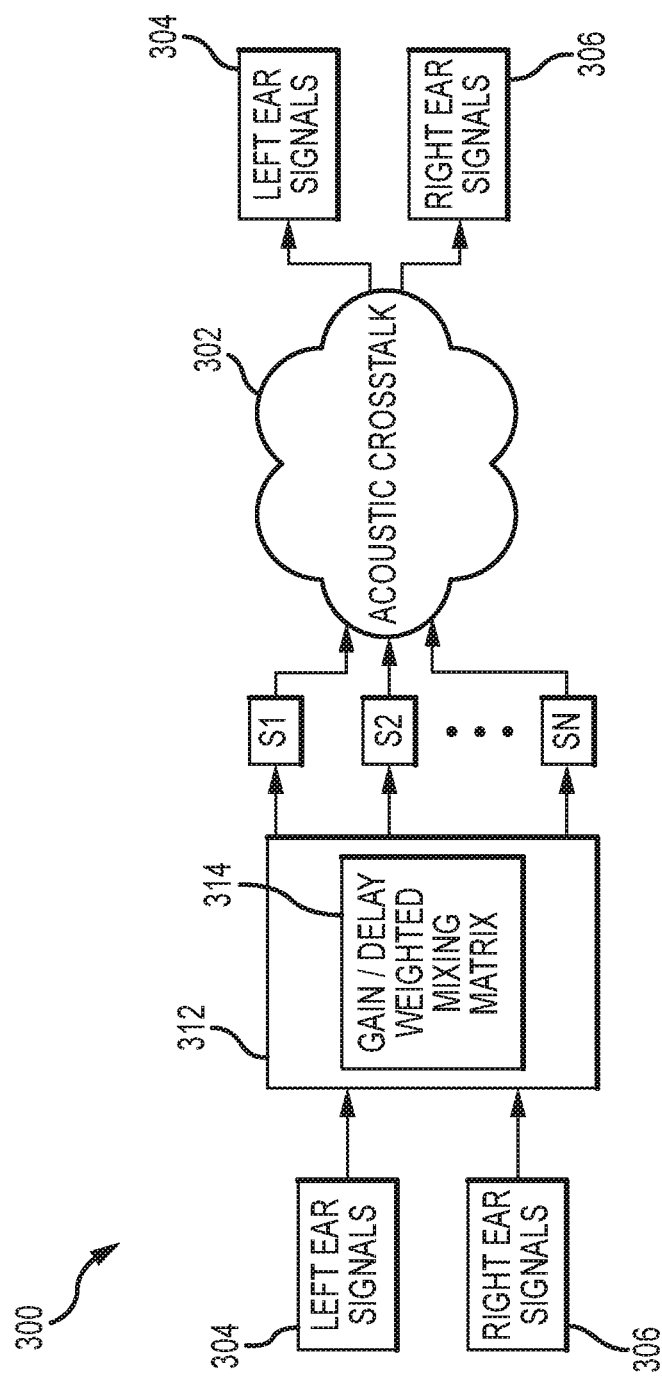

Referring now to FIGS. 3a and 3b, crosstalk cancellation processing 300 is employed to counter the effects of acoustical crosstalk 302 so that the binaural left ear signals 304 and binaural right ear signals 306 (electrical) are recovered (acoustically) at each ear. Acoustical crosstalk occurs when a binaural left ear signal S1 follows both a desired path to a listener's left ear 308 and a crosstalk path to the listener's right ear 310 and a binaural right ear signal S2 follows both a desired path to the listener's right ear 310 and a crosstalk path to the listener's left ear 308. A CTC filter 312 implements a gain/delay weighted mixing matrix 314 that introduces anti-crosstalk. Mixing matrix 314 pre-conditions the left and right ear signals 304 and 306 by forming weighted combinations of the variously delayed or filtered left and right ear signals to form transaural audio signals S1 through SN. The matrix is configured such that upon presentation of signals S1 through SN through the acoustical crosstalk conditions 302 the left ear signal and right ear signal are recovered at each ear. For example, S1 is constructed of some amount of the left ear signal 304 minus a delayed amount of the right ear signal 306 and S2 is constructed of some amount of the right ear signal 306 minus a delayed amount of the left ear signal 304. This is what allows cancellation to occur.

The weighted mixing matrix 314 is traditionally constructed assuming symmetric pairs of audio speakers 316 and 318 that reproduce the left and right ear signals at the listener position. Speakers 316 and 318 exhibit the same magnitude response and are equidistant to the listener's left and right ears. For two-channel audio there is a single pair of symmetric speakers 316 and 318. For multi-channel audio there are multiple pairs of symmetric speakers 316/318, 320/322 etc. Different pairs may have different speakers and distances to the listener position but are symmetric within the pair.

The symmetry constraint dictates a modular solution for the GPEQ solution. This is preferred for a number of reasons. First, the symmetry condition simplifies the mixing matrix and CTC filter. Second, because the transaural signals are formed by mixing multiple input channels, integrating the asymmetry of the GPEQ (which is determined only by the transaural system response of each output channel) into the crosstalk design would be unnecessarily complicated and likely require processing multiple paths independently increasing cost. It is therefore better to implement an efficient/simplified CTC design and use the GPEQ to ensure the efficient CTC experiences the assumed symmetric conditions.

Referring now to FIG. 4, an embodiment of a GPEQ filter 400 for pre-conditioning two-channel transaural audio 402 for reproduction on left and right speakers comprises (in any order as all filters are linear time invariant filters) an asymmetric FIR filter bank 404 and an IIR filter bank 406.

The asymmetric FIR filter bank 404 comprises left and right FIR filters 408 and 410, respectively, asymmetrically configured to normalize the magnitude responses of the left and right audio speakers to a target response above a low frequency cross-over Fc of the audio speakers as reproduced at the listener position. A speaker's cross-over frequency is defined as the start of the passband for the speaker's frequency response specification or simply as the point below which the speaker response falls out of passband specification (such as +/−3 dB from its reference output level). The Fc selected by the GPEQ design may, for example, be the minimum or average cross-over frequency of the speakers. The target response may include an average magnitude response of the at least two audio speakers. The target response may further include general equalization shaping (such as a high frequency leveling or flattening) but it is recommended this is similarly constrained to be above the selected Fc.

The # of taps (length) of the FIR filters is, at least initially, determined by a specification on the similarity of the corrected magnitude responses to the target response. The # of taps may be reduced based on the hardware capabilities of the audio device. A critical aspect of the GPEQ filter is the length of the asymmetric FIR filter bank. To support real-time processing and reproduction of audio on a consumer mobile device, the filter length should be as short as possible. The filter length is reduced in a number of ways. First, the function of the FIR filter is suitably limited to only remove the asymmetry, and not perform speaker protection and EQ. Second, the FIR filter only removes asymmetry above the low-frequency cross-over Fc. Low frequency processing has a disproportionate impact on the length of an FIR filter. Clamping the magnitude response of the FIR at 0 dB below Fc reduces the filter length. Third, driving the magnitude responses to a target response that includes (and is dominated by) an average magnitude response of the left and right speakers is easier than driving the magnitude responses to a more traditional "flat" target response. As a result, a shorter FIR filter can satisfy the similarity specification.

The asymmetric FIR filter bank may be configured to include delays 412 and 414 to normalize group delay and the phase responses of the left and right audio speakers at the listener position. The delays are equal to a base delay plus a maximum time-of-arrival (TOA) delay (i.e. the TOA delay to the furthest speaker) less the TOA delay of the corresponding speaker. The delay for the furthest speaker is just the base delay. The delay for the closest speaker is the base delay plus the difference in the TOA to the furthest and closest speakers. The delays may be implemented as discrete delays separate from the FIR filters or incorporated in the FIR filters. The transaural audio signals are each represented as a sequence of audio samples sampled at a sample period. The delay may be implemented as a non-integer number of sample periods.

The IIR filter bank 406 includes a symmetric IIR filter bank component 416 configured to high pass filter above the low frequency cross-over Fc and equalize the magnitude responses of the at least two audio speakers. Essentially, a standard manual PEQ process is performed on the target response to which both the left and right channels have been normalized. The symmetric IIR filter bank component includes, for example, a number of $2^{nd}$ order IIR parametric filter sections each tuned to boost or cut a different spectral band. A critical aspect of the GPEQ filter is the total order of IIR filter bank. Because this component is limited to only performing the traditional functions of speaker protection and EQ, and not asymmetry correction, the total number of filter sections and overall filter order is limited and capable of real-time processing and reproduction of audio on a consumer mobile device.

The IIR filter bank 406 may further include an asymmetric IIR filter bank component 418 configured to correct residual asymmetry in the magnitude responses of the left and right audio speakers near the low-frequency cross-over Fc while preserving the relative phases of the at least two transaural audio signals. For example, the asymmetric IIR filter bank may force the left and right magnitude responses to be equal at Fc, which may affect the magnitude responses near Fc. In many audio devices this component may not be required. In those devices in which it is needed, its application is limited to correcting a very few "bumps" or "dips" in the magnitude responses near Fc for which IIR filter sections are well suited. Manually tuning a few "bumps" or "dips" is manageable as compared to removing all of the asymmetry above Fc.

Phase preservation of the asymmetric IIR filters is crucial in order to reproduce transaural audio at the listener position. Phase preservation is ensured in part by limiting the use of asymmetric IIR filters to at most a few sections and by using phase-balanced or phase-compensated IIR filter sections (the latter as shown in FIG. 4).

The phase-balanced IIR filters are those described by Peter Eastty, "Balanced Phase Equalization; IIR Filters with Independent Frequency Response and Identical Phase Response" AES Convention October 2012, which is hereby incorporated by reference. Each section comprises first and second EQ filters and a balancing filter. The first EQ filter has one-half of the magnitude response to produce a first phase response. The second EQ filter has the same one-half of the magnitude response with the zeros reciprocated about the unit circle to produce a second phase response that negates a portion of the first phase response due to system zeros while equalizing one of the transaural audio signals. The balancing filter has an all-pass magnitude response with a third phase response equal to a combination of the first and second phase responses to negate a portion of the first phase response due to system poles to preserve the relative phase for all of the other transaural audio signals. Eastty's phase-balanced IIR filters provide perfect phase-preservation but at the cost of three separate filters per section.

Phase-compensated IIR filters were developed to provide sufficient phase-preservation at a reduced cost of two filters per section. Each section includes only an EQ filter 420 having the magnitude response and a first modified phase response to equalize one of the transaural audio signals and a balancing filter 422 having an all-pass magnitude response and a phase response to phase balance all of the other transaural audio signals. The EQ filter and balancing filter are of the same order. The first modified phase response is achieved by creating a non-minimum phase equivalent of the designed EQ by reciprocating the system zeros to outside the unit circle. In theory, the phase response of the balancing filter is equal to the modified phase response. In practice, the phase response must be close enough that any error in the phase preservation is less than a threshold determined to be detrimental to the transaural phase relationships.

Embodiments of the GPEQ filter 400 may include an N-tap FIR filter bank 404 of which M<=N taps are asymmetrically configured with coefficients for a particular audio device and an IIR filter bank 406 including X IIR filter sections of which Y sections are symmetrically configured with coefficients for the audio device and Z sections are asymmetrically configured with coefficients for the audio device where Y+Z<=X. In this manner, the architecture and hardware to implement the GPEQ filter is universal to the class(es) of audio devices. Each of the laptops, tablets, phones or headphones is implemented with the same GPEW filter hardware. All that changes are the coefficients that are loaded into the GPEQ filter for a particular device.

Figure 5A:
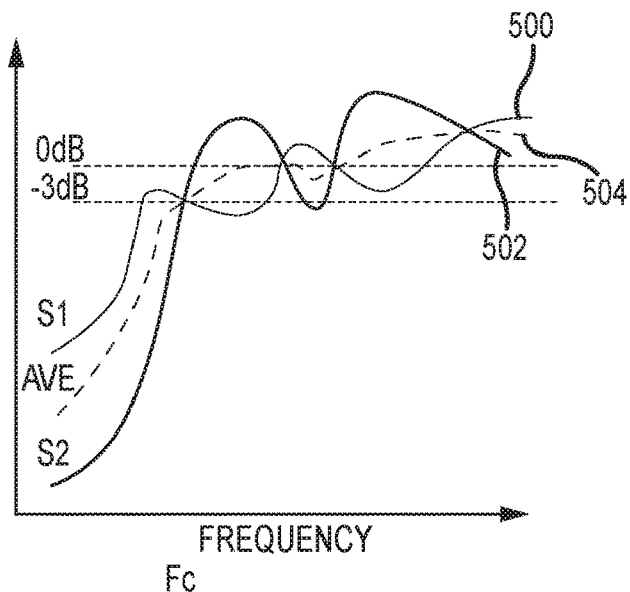

Referring now to FIGS. 5a through 5h, exemplary plots of the raw speaker magnitude responses for L and R audio channels, filter responses and modified speaker responses for the asymmetric FIR, asymmetric IIR and symmetric IIR, and overall GPEQ filter response are illustrated. For clarity, the filter responses are only shown for the left channel S1. FIG. 5a depicts the asymmetric magnitude responses 500 and 502 for the left (S1) and right (S2) audio channels and an average magnitude response 504. In this example, the low-frequency cross-over Fc is defined at the −3 dB point.

Figure 5B:
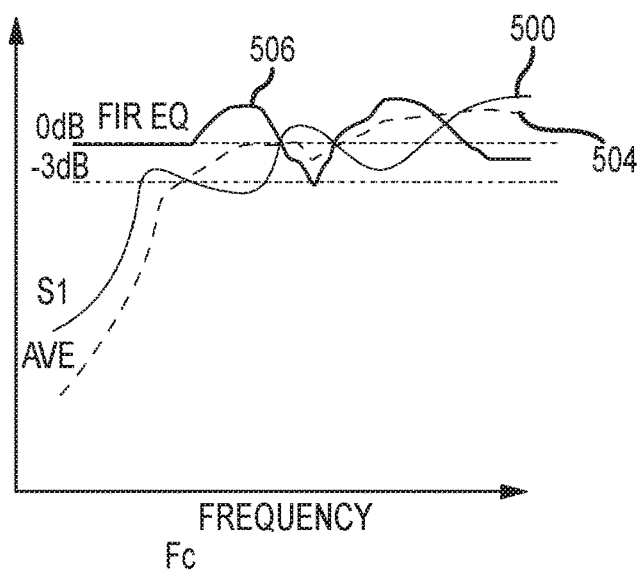
Figure 5C:
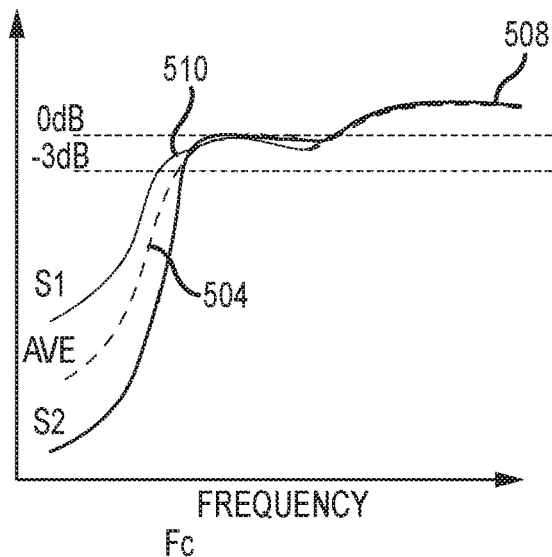

FIG. 5b depicts an FIR filter response 506 configured to normalize magnitude response 500 for S1 to the average magnitude response 504 above Fc. Below Fc, filter response 506 is clamped to 0 dB. The FIR filter response for S2 would be different, "asymmetric", to drive that magnitude response to the average above Fc and also clamped to 0 dB below Fc. In effect, the FIR filters do not process audio content below Fc. FIG. 5c depicts the normalized S1 and S2 magnitude responses 508 and 510, respectively, which have been driven to the average magnitude response 504 above Fc and unaffected below Fc.

Figure 5D:
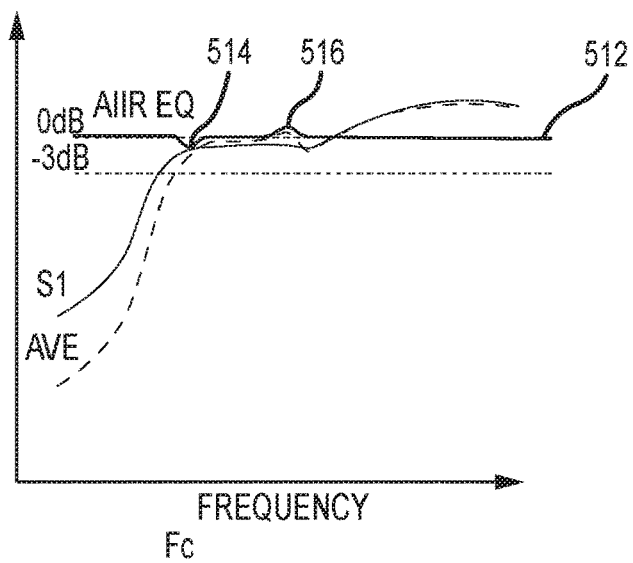
Figure 5E:
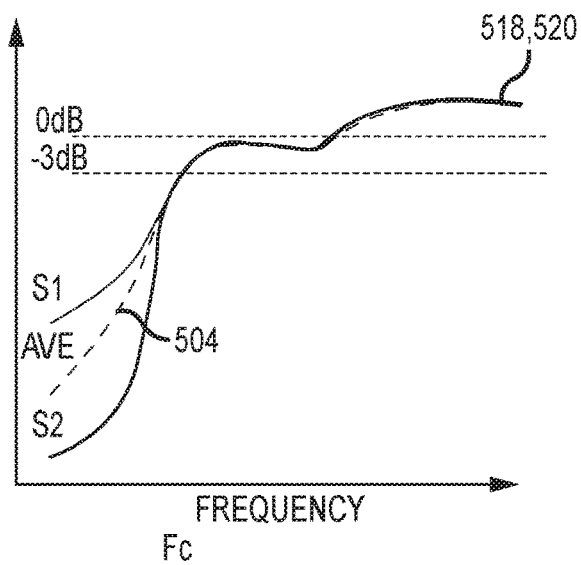

FIG. 5d depicts an asymmetric IIR EQ 512 configured to remove residual asymmetry for S1 near the low-frequency cross-over Fc. In this example, the asymmetric component includes an IIR section 514 to "cut" energy at Fc and an IIR section 516 to "boost" energy above Fc to remove the residual asymmetry. The IIR filter sections for S2 would be different, "asymmetric", to correct any residual asymmetry and drive S2 to the average. FIG. 5e depicts normalized S1 and S2 magnitude responses 518 and 520, respectively, which have been driven to the average magnitude response 504 above Fc and unaffected below Fc with any residual asymmetry removed.

Figure 5F:
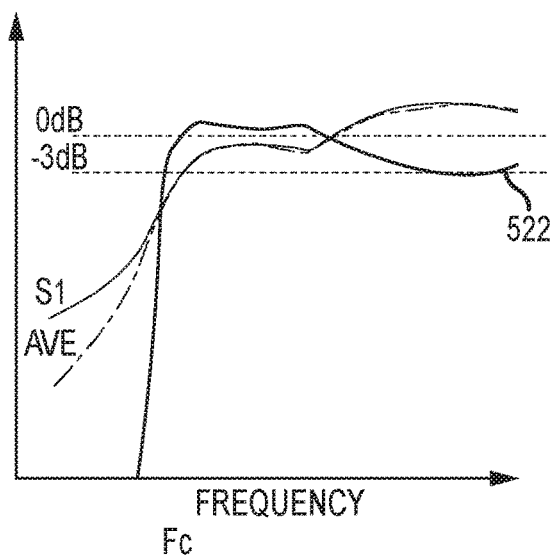
Figure 5G:
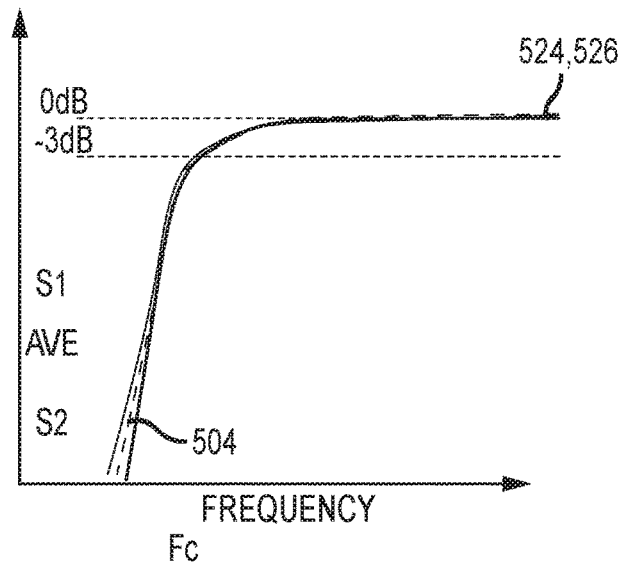

FIG. 5f depicts a symmetric IIR EQ 522 for S1 (and S2) to perform speaker protection by high pass filtering above Fc and EQ on the average magnitude response (target response) above Fc. FIG. 5g depicts the equalized magnitude responses 524 and 526 above Fc and the high pass filtered responses below Fc.

Figure 5H:
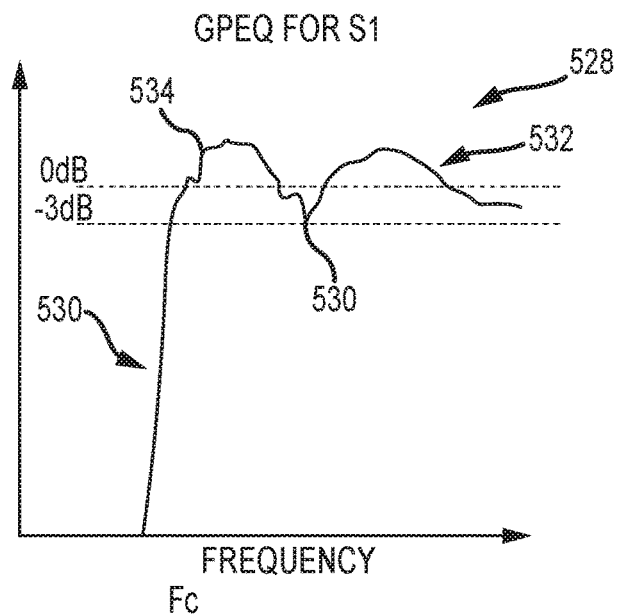

FIG. 5h depicts a response 528 for the GPEQ filter. The response includes a HPF section 530 from the symmetric IIR EQ, an asymmetric section 532 above Fc to normalize S1 to the average magnitude response and a "bump" 534 and a "dip" 536 to remove residual asymmetry near Fc.

Referring now to FIGS. 6 and 7, embodiments of a tuning system 600 and method 700 for tuning generate coefficients for a GPEQ filter to pre-condition transaural audio signals to remove speaker asymmetries as well as provide speaker protection and EQ for an audio device 602. The GPEQ filter 604 suitably reflects the universal architecture having N FIR filter taps and X $2^{nd}$ order IIR filter sections per audio channel. An automated filter design module (computer implemented) 606 operates in an automated tuning mode using a microphone 608 to tune the asymmetric FIR filter bank and generate filter coefficients 610 and in a manual tuning mode using a person 612 to tune the asymmetric FIR filter bank, asymmetric IIR filter bank or symmetric filter bank and generate filter coefficients 610 to render an instantiation 614 of GPE filter 604 for a particular audio device.

An embodiment of tuning method 700 for audio device 602 includes the steps of determining whether the audio device exhibits an asymmetric speaker magnitude response or speaker position with respect to listener position (702); typically evident from mechanical design, or rudimentary frequency response measurements or listening tests involving each and both speakers. Note, the universal GPEQ filter and method of tuning can be used for any audio device, whether symmetric or asymmetric. If the audio device is symmetric, a manual parametric EQ (PEQ) tuning process is performed (step 704), and the automated filter design module generates coefficients for one or more symmetric IIR filter sections to render the GPEQ filter (step 706). The manual parametric EQ process involves a sound designer/engineer playing typical audio content or test signals on the device and adjusting the overall frequency response to an objective standard or subjective taste suitable for the device. Alternatively, it may be automated or semi-automated to "flatten" the frequency response to a target curve. The key is only that all aspects are symmetrical and the same equalization filters are applied to all channels.

If the audio device is asymmetric, a low-frequency cross-over Fc of the device's audio speakers is determined (step 708). This determination can be made based on the specifications of the audio speakers, controlled testing or listener perception. An overall Fc is selected to represent the Fc of all channels that is used in GPEQ design. Fc may be the minimum or an average of the two or more speakers. Fc is typically defined as the effective low-end of the bandwidth for the speakers below which the response is consider to be weak or prone to distortions. Fc can be determined by inspection of a relative roll-off in dB from the obvious passband or average level of the smoothed response or algorithmically.

The next step is to tune, automatically (step 710) and/or manually (step 712), an asymmetric FIR filter bank to normalize the magnitude responses of the at least two audio speakers to a target response above the low-frequency cross-over Fc. Automatic solutions involve direct inversion of the measured response to the target response. Manual operations involve a skilled operator or sound designer asymmetrically equalizing the system. In some cases, it may be desired that a manual adjustment be made on top of the automatic results. In all cases discussed here, the resulting asymmetric equalization responses are reduced to an asymmetric FIR filter bank having symmetric phase. This is typically achieved by converting the responses to linear phase equalization filters of the same order or group delay. The target response may include (and be dominated by) an average magnitude response of the audio speakers. It is important that tuning of the asymmetric FIR filter bank to drive both audio channels to the target response be done prior to general EQ of the overall response for either speaker. The automated filter design module generates the # of taps and coefficients for the FIR filters for each channel.

The next step is to determine if the device's audio speakers are positioned asymmetrically with respect to listener position (step 714). If yes, the process introduces compensation delays (step 716) to normalize the time-of-arrival (TOA) or "group delay" of the at least two transaural audio signals at the listener position. The delays can be implemented as discrete components or integrated as part of the FIR filters by adding the relative delay shift to the otherwise symmetric group delays of the linear phase FIR filters. For example, if the base linear phase filters have a delay of N samples and one channel needs a delay of M samples. Then the linear phase filter on that side can be designed to have N+M samples while the other has only N. The filter maybe suitably windowed to retain the same number of taps for each FIR filter.

The next step is to determine if there is any residual asymmetry left in the speaker's corrected magnitude responses near the cross-over Fc that requires additional correction (718) and was not corrected by manual FIR tuning (712). This determination can be made manually or via computer by comparing the corrected magnitude response to the average magnitude response to identify any "bumps" or "dips" and their corresponding frequency band. If yes, a manual phase-preserving parametric EQ (PEQ) tuning process is performed (step 720), and the automated filter design module generates coefficients for one or more asymmetric IIR filter sections for each channel to remove the residual asymmetry. All of the FIR coefficients and IIR coefficients are output at step 706 to render the GPEQ filter for the particular audio device.

Referring now to FIG. 8, an embodiment for automated tuning 800 of the asymmetric FIR filter bank includes the steps of measuring responses for each speaker (step 802), determining magnitude responses and relative delays for the audio speakers to the listener position (step 804) and computing an average magnitude response from the measured magnitude responses (step 806). The automated filter design module computes minimum phase FIR filter responses that invert each magnitude response to the average magnitude response (target response) above the low frequency cross-over Fc and clamps the magnitude response to 0 dB below the low-frequency cross-over Fc (step 808). The module windows the impulse response and converts each minimum phase filter response to a linear phase FIR filter having an equivalent magnitude and delay equal to a base delay plus a maximum time-of-arrival (TOA) delay less the actual TOA delay of the transaural audio signal reproduced by the speaker (step 810). The base delay is determined by zero-padding all minimum phase filters to the same length "L" before conversion to linear phase. This can be selected as the largest required length based on the inversion criteria for any channel or by some compromise of the required lengths. Since the linear phase filters will all be symmetric impulse responses based on the minphase filters, the final length "N" will also be the same and have the same base delay $(N-1)/2 \approx L$.

The frequency response measurements of step 802 may be collected via log-swept-sin measurement (LSS) of the impulse response, which separates the direct response from harmonic distortion. Reflections may be windowed to obtain a pseudo anechoic response of only the speaker transducer and enclosure. Optionally, the measurements may be collected from multiple physical positions and/or multiple units of the same model to verify or average into an aggregate response less coupled to a particular sample unit or listening position.

The average magnitude response of step 806 may be constructed from the magnitudes of the frequency response from each measurement. Frequency domain/critical band smoothing may be utilized to reduce reactiveness to features with high "Q" factors or those not representative of the listener experience. Optionally, the average magnitude response may be created from a composite of measurements of different positions or hardware samples.

Referring now to FIG. 9, an embodiment for manual tuning 900 of the asymmetric FIR filter bank includes the steps of manually tuning asymmetric IIR filters to equalize each speaker magnitude response (step 902), essentially performing an asymmetric PEQ where the sound designer/tuning engineer attempts to increase similarity of the speakers primarily above the cut-off frequency Fc determined by their assessment. The automated filter design module computes an aggregate impulse response for each audio channel (step 904) by finding the combine impulse response of all the bands used, windows this aggregate impulse response to create a single minimum phase FIR filter for each audio channel (step 906) and converts each FIR filter to a linear phase FIR filter having a delay equal to a base delay plus a maximum TOA delay less the TOA delay of the transaural audio signal reproduced by the speaker (step 908). In the case of manual tuning, these delays may have been measured directly or may be estimated and adjusted directly by the sound designer/tuning engineer to achieve the desired time alignment of the speakers.

Referring now to FIGS. 10a-10c, an embodiment for manual tuning of the phase-preserving asymmetric IIR filter sections 1000 includes the steps of performing an asymmetric PEQ to identify the spectral bands (IIR filter sections) to be tuned (boost or cut) and the magnitude and phase response of each section and designing a phase-balanced IIR section for each spectral band to implement the specified boost or cut. Each section of phase-balanced IIR filters comprises a first EQ filter 1002 having one-half of the magnitude response $M_{eq1}$ 1004 ($M_{eq}=2*M_{eq1}$) to produce a first phase response Peq1 1006, a second EQ filter 1008 having the same one-half of the magnitude response $M_{eq1}$ 1010 with the zeros reciprocated about the unit circle to produce a second phase response Peq1 1012 that negates a portion of the first phase response due to system zeros while equalizing one of the transaural audio signals and a balancing filter 1014 having an all-pass magnitude response $M_{ap}$ 1016 with a third phase response $P_{ap}=P_{eq1}°P_{eq2}$ 1018 equal to a combination of the first and second phase responses to negate a portion of the first phase response due to system poles to preserve the relative phase for all of the other transaural audio signals. The advantages of the phase-balanced IIR filter is that it provides perfect phase-preservation but at the cost of the three filters per audio channel.

Referring now to FIGS. 11a-11b, an embodiment for manual tuning of the phase-preserving asymmetric HR filter sections 1100 includes the steps of performing an asymmetric PEQ to identify the spectral bands (IIR filter sections) to be tuned (boost or cut) and the magnitude and phase response of each section and designing a compensated-phase IIR section for each spectral band to implement the specified boost or cut.

Each section includes only an EQ filter 1102 having the magnitude response $M_{eq}$ 1104 and a first modified phase response $P_{eq}$ 1106 to equalize one of the transaural audio signals and a balancing filter 1108 having an all-pass magnitude response $M_{ap}$ 1110 and a phase response $P_{ap} \cong P_{eq}$ 1102 to phase balance all of the other transaural audio signals. The EQ filter and balancing filter are of the same order. The first modified phase response $P_{eq}$ 1106 is achieved by creating a non-minimum phase equivalent of the designed EQ by reciprocating the system zeros to outside the unit circle. Ideally phase response 1102 is equal to the first modified phase response 1106 but in practice need only be close enough that the error is less than a threshold determined to be detrimental to the transaural phase relationships by the sound designer or tuning engineer. The compensated-phase IIR does not account for phase induced by zeros, and thus is not perfectly balanced. However, for a class of equalization filters including PEQ, High and Low Shelf with the levels and settings common to these kinds of equalization tasks, the stated method achieves significantly better phase matching than an untreated (without balancing) or unmodified PEQ section which is not able to be easily balanced by a similarly ordered allpass filter. The advantage of this approach is that it results in having only two filters per channel.

The following is a method of designing the compensated phase IIR sections for a PEQ filter. One skilled in the art can see how the method could be repeated for other EQ shapes such as shelving filters etc. First, the PEQ filter (typically described by center frequency Fc, sample rate Fs, gain G and quality or bandwidth Q) is designed using the standard methods. This filter will typically be a second order section or "biquad" which exhibits a minimum phase response. This phase response is of a complex shape around the center frequency and difficult to balance with a similarly ordered allpass filter. An excess-phase equivalent is created by solving the roots of the normalized numerator coefficients, reciprocating about the unit circle and reconvolving them into a new set of numerator coefficients which exhibit the same gain but an excess phase. This modified filter is EQ1 (1102). Next, a prototype filter is created for the compensating allpass. There are multiple methods to find an allpass filter with similar phase to EQ1, but one exemplary method is to simply use the same PEQ design method as in EQ1, but for a gain of 0 dB. Since it has all other parameters and critical frequencies the same as the PEQ, this results in a minimum phase allpass filter which has the same pole locations as EQ1. The same process is used to reciprocate the zeros outside the unit circle, resulting in the final compensating allpass filter (1108). The phase responses of the two filters will be similar enough that they do not disrupt the transaural audio signals. However, the final phase response can be manually dialed in further by manipulating the radius of the poles and zeros relative to the unit circle until the desired psychoacoustic effects are observed.

When applying such filters, the modified PEQ is applied on the original channel being equalized and the allpass filter is applied to all other channels that require phase alignment with the equalized channel.

Many other variations than those described herein will be apparent from this document. For example, depending on the embodiment, certain acts, events, or functions of any of the methods and algorithms described herein can be performed in a different sequence, can be added, merged, or left out altogether (such that not all described acts or events are necessary for the practice of the methods and algorithms). Moreover, in certain embodiments, acts or events can be performed concurrently, such as through multi-threaded processing, interrupt processing, or multiple processors or processor cores or on other parallel architectures, rather than sequentially. In addition, different tasks or processes can be performed by different machines and computing systems that can function together.

The various illustrative logical blocks, modules, methods, and algorithm processes and sequences described in connection with the embodiments disclosed herein can be implemented as electronic hardware, computer software, or combinations of both. To clearly illustrate this interchangeability of hardware and software, various illustrative components, blocks, modules, and process actions have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of this document.

The various illustrative logical blocks and modules described in connection with the embodiments disclosed herein can be implemented or performed by a machine, such as a general purpose processor, a processing device, a computing device having one or more processing devices, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor and processing device can be a microprocessor, but in the alternative, the processor can be a controller, microcontroller, or state machine, combinations of the same, or the like. A processor can also be implemented as a combination of computing devices, such as a combination of a DSP and a microprocessor, a plurality of microprocessors, one or more microprocessors in conjunction with a DSP core, or any other such configuration.

Embodiments of the GPEQ filter and tuning methods described herein are operational within numerous types of general purpose or special purpose computing system environments or configurations. In general, a computing environment can include any type of computer system, including, but not limited to, a computer system based on one or more microprocessors, a mainframe computer, a digital signal processor, a portable computing device, a personal organizer, a device controller, a computational engine within an appliance, a mobile phone, a desktop computer, a mobile computer, a tablet computer, a smartphone, and appliances with an embedded computer, to name a few.

Such computing devices can be typically be found in devices having at least some minimum computational capability, including, but not limited to, personal computers, server computers, hand-held computing devices, laptop or mobile computers, communications devices such as cell phones and PDA's, multiprocessor systems, microprocessor-based systems, set top boxes, programmable consumer electronics, network PCs, minicomputers, mainframe computers, audio or video media players, and so forth. In some embodiments the computing devices will include one or more processors. Each processor may be a specialized microprocessor, such as a digital signal processor (DSP), a very long instruction word (VLIW), or other micro-controller, or can be conventional central processing units (CPUs) having one or more processing cores, including specialized graphics processing unit (GPU)-based cores in a multi-core CPU.

The process actions of a method, process, or algorithm described in connection with the embodiments disclosed herein can be embodied directly in hardware, in a software module executed by a processor, or in any combination of the two. The software module can be contained in computer-readable media that can be accessed by a computing device. The computer-readable media includes both volatile and nonvolatile media that is either removable, non-removable, or some combination thereof. The computer-readable media is used to store information such as computer-readable or computer-executable instructions, data structures, program modules, or other data. By way of example, and not limitation, computer readable media may comprise computer storage media and communication media.

Computer storage media includes, but is not limited to, computer or machine readable media or storage devices such as Blu-ray discs (BD), digital versatile discs (DVDs), compact discs (CDs), floppy disks, tape drives, hard drives, optical drives, solid state memory devices, RAM memory, ROM memory, EPROM memory, EEPROM memory, flash memory or other memory technology, magnetic cassettes, magnetic tapes, magnetic disk storage, or other magnetic storage devices, or any other device which can be used to store the desired information and which can be accessed by one or more computing devices.

A software module can reside in the RAM memory, flash memory, ROM memory, EPROM memory, EEPROM memory, registers, hard disk, a removable disk, a CD-ROM, or any other form of non-transitory computer-readable storage medium, media, or physical computer storage known in the art. An exemplary storage medium can be coupled to the processor such that the processor can read information from, and write information to, the storage medium. In the alternative, the storage medium can be integral to the processor. The processor and the storage medium can reside in an application specific integrated circuit (ASIC). The ASIC can reside in a user terminal. Alternatively, the processor and the storage medium can reside as discrete components in a user terminal.

The phrase "non-transitory" as used in this document means "enduring or long-lived". The phrase "non-transitory computer-readable media" includes any and all computer-readable media, with the sole exception of a transitory, propagating signal. This includes, by way of example and not limitation, non-transitory computer-readable media such as register memory, processor cache and random-access memory (RAM).

The phrase "audio signal" is a signal that is representative of a physical sound.

Retention of information such as computer-readable or computer-executable instructions, data structures, program modules, and so forth, can also be accomplished by using a variety of the communication media to encode one or more modulated data signals, electromagnetic waves (such as carrier waves), or other transport mechanisms or communications protocols, and includes any wired or wireless information delivery mechanism. In general, these communication media refer to a signal that has one or more of its characteristics set or changed in such a manner as to encode information or instructions in the signal. For example, communication media includes wired media such as a wired network or direct-wired connection carrying one or more modulated data signals, and wireless media such as acoustic, radio frequency (RF), infrared, laser, and other wireless media for transmitting, receiving, or both, one or more modulated data signals or electromagnetic waves. Combinations of the any of the above should also be included within the scope of communication media.

Further, one or any combination of software, programs, computer program products that embody some or all of the various embodiments of the GPEQ filter and tuning methods for asymmetric transaural audio reproduction described herein, or portions thereof, may be stored, received, transmitted, or read from any desired combination of computer or machine readable media or storage devices and communication media in the form of computer executable instructions or other data structures.

Embodiments of the GPEQ filter and tuning methods for asymmetric transaural audio reproduction described herein may be further described in the general context of computer-executable instructions, such as program modules, being executed by a computing device. Generally, program modules include routines, programs, objects, components, data structures, and so forth, which perform particular tasks or implement particular abstract data types. The embodiments described herein may also be practiced in distributed computing environments where tasks are performed by one or more remote processing devices, or within a cloud of one or more devices, that are linked through one or more communications networks. In a distributed computing environment, program modules may be located in both local and remote computer storage media including media storage devices. Still further, the aforementioned instructions may be implemented, in part or in whole, as hardware logic circuits, which may or may not include a processor.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments of the inventions described herein can be embodied within a form that does not provide all of the features and benefits set forth herein, as some features can be used or practiced separately from others.

Moreover, although the subject matter has been described in language specific to structural features and methodological acts, it is to be understood that the subject matter defined in the appended claims is not necessarily limited to the specific features or acts described above. Rather, the specific features and acts described above are disclosed as example forms of implementing the claims.

What is claimed is:

1. A gain phase equalization (GPEQ) filter for pre-conditioning at least two transaural audio signals carried in respective audio channels for transaural reproduction at a listener position by an audio device having a like number of audio speakers that exhibit an asymmetric magnitude response, said GPEQ filter comprising:
    an asymmetric FIR filter bank configured to normalize the magnitude responses of the at least two audio speakers to a target response above a low frequency cross-over Fc of the audio speakers as reproduced at the listener position; and
    an IIR filter bank including a symmetric IIR filter bank component configured to high pass filter above the low frequency cross-over Fc and equalize the normalized magnitude responses of the at least two audio speakers while maintaining a relative phase relationship of the transaural audio signals;
    wherein the IIR filter bank further includes an asymmetric IIR filter bank component configured to correct residual asymmetry in the magnitude responses of the at least two audio speakers near the low-frequency cross-over Fc while preserving the relative phases of the at least two transaural audio signals.

2. The GPEQ filter of claim 1, wherein the target response includes an average magnitude response of the at least two audio speakers.

3. The GPEQ filter of claim 1, wherein said like number of audio speakers are positioned asymmetrically with respect to said listener position to exhibit an asymmetric phase response, said asymmetric FIR filter bank configured to include a delay to normalize group delay and the phase responses of the at least two audio speakers at the listener position.

4. The GPEQ filter of claim 3, wherein the transaural audio signals are each represented as a sequence of audio samples sampled at a sample period, wherein the delay is a non-integer number of sample periods.

5. The GPEQ filter of claim 3, wherein the asymmetric FIR filter is configured to only normalize the magnitude responses and group delays of the at least two audio speakers and the symmetric IIR filter bank component is configured to only high pass filter and equalize the magnitude responses of at least two audio speakers.

6. The GPEQ filter of claim 1, wherein said like number of audio speakers are positioned asymmetrically with respect to said listener position, further comprising a delay-only element with an all-pass magnitude response to normalize group delay and phase responses of the at least two audio speakers at the listener position.

7. The GPEQ filter of claim 1, wherein the asymmetric IIR filter bank component is configured to equate the magnitude responses of the at least two audio speakers at the low-frequency cross-over Fc.

8. The GPEQ filter of claim 1, wherein the asymmetric IIR filter bank component comprises phase-balanced IIR filters, each section of phase-balanced IIR filters comprising:
    a first EQ filter having one-half of the magnitude response to produce a first phase response and a second EQ filter having the same one-half of the magnitude response with zeros reciprocated about a unit circle to produce a second phase response that negates a portion of the first phase response due to system zeros while equalizing one of the transaural audio signals; and
    a balancing filter having an all-pass magnitude response with a third phase response equal to a combination of the first and second phase responses to negate a portion of the first phase response due to system poles to preserve the relative phase for all of the other transaural audio signals.

9. The GPEQ filter of claim 1, wherein the asymmetric IIR filter bank component comprises phase compensated IIR filters in which each section includes only an EQ filter having the magnitude response and a first modified phase response to equalize one of the transaural audio signals and a balancing filter having an all-pass magnitude response and a second modified phase response to phase balance all of the other transaural audio signals, wherein the first and second modified phase responses of the EQ and balancing filters are the excess phase equivalents of the EQ as designed and as designed but using 0 dB gain respectively.

10. The GPEQ filter of claim 9, wherein the EQ filter and the balancing filter have the same filter order.

11. The GPEQ filter of claim 1, in which the GPEQ filter includes:
    an N-tap FIR filter bank of which M<=N taps are asymmetrically configured with coefficients for the audio device; and
    an IIR filter bank including X IIR filter sections of which Y sections are symmetrically configured with coefficients for the audio device and Z sections are asymmetrically configured with coefficients for the audio device where Y+Z<=X.

12. The GPEQ filter of claim 1, wherein the asymmetric FIR filter bank is a linear phase FIR filter bank.

13. A gain phase equalization (GPEQ) filter for pre-conditioning left and right transaural audio signals carried in respective audio channels for transaural reproduction at a listener position by an audio device having left and right audio speakers that exhibit asymmetric magnitude responses and an asymmetric time-of-arrival (TOA) to the listener position, said GPEQ filter comprising:
- an asymmetric FIR filter bank configured to only normalize the magnitude responses of the at least two audio speakers to a target response that includes an average magnitude response of the left and right audio speakers above a low frequency cross-over Fc of the audio speakers and normalize the TOA of the left and right transaural audio signals at the listener position; and
- an IIR filter bank including a symmetric IIR filter bank component configured to only high pass filter above the low frequency cross-over FC and equalize the normalized magnitude responses of the left and right audio speakers and an asymmetric IIR filter bank component configured to only correct residual asymmetry in the magnitude responses of the left and right audio speakers near the low-frequency cross-over Fc while preserving a relative phase of the left and right transaural audio signals;
- wherein the IIR filter bank further includes an asymmetric IIR filter bank component configured to correct residual asymmetry in the magnitude responses of the left and right audio speakers near the low-frequency cross-over Fc while preserving the relative phases of the left and right transaural audio signals.

14. The GPEQ filter of claim 13, wherein the asymmetric IIR filter bank component comprises phase compensated IIR filters in which each section includes only an EQ filter having the magnitude response and a first modified phase response to equalize one of the transaural audio signals and a balancing filter having an all-pass magnitude response and a phase response to phase balance all of the other transaural audio signals.

15. An audio device for transaural audio rendering at a listener position, comprising:
- a processor configured to generate a plurality of binaural audio signals in respective audio channels;
- a crosstalk cancellation filter configured to process the binaural audio signals and output a plurality of transaural audio signals in the respective audio channels;
- a plurality of audio speakers configured to render the plurality of transaural audio signals at the listener position, said plurality of audio speakers exhibiting a low frequency cross-over Fc and an asymmetric magnitude response; and
- a gain phase equalization (GPEQ) filter for pre-conditioning the at least two transaural audio signals, said GPEQ filter comprising:
  - an asymmetric FIR filter bank configured to normalize the magnitude responses of the at least two audio speakers above the low frequency cross-over Fc to a target response that includes an average magnitude response of the at least two audio speakers as reproduced at the listener position; and
  - an IIR filter bank including a symmetric IIR filter bank component configured to high pass filter above the low frequency cross-over Fc and equalize the normalized magnitude responses of the at least two audio speakers while maintaining a relative phase relationship of the transaural audio signals;
  - wherein the IIR filter bank further includes an asymmetric IIR filter bank component configured to correct residual asymmetry in the magnitude responses of the at least two audio speakers near the low-frequency cross-over Fc while preserving the relative phases of the at least two transaural audio signals.

16. The audio device of claim 15, wherein the plurality of audio speakers are positioned asymmetrically with respect to the listener position, said asymmetric FIR filter bank configured to include a delay to normalize a time-of-arrival (TOA) of the at least two transaural audio signals at the listener position.

17. A method of tuning a gain phase equalization (GPEQ) filter for pre-conditioning at least two transaural audio signals carried in respective audio channels for transaural reproduction at a listener position by an audio device having a like number of audio speakers that exhibit an asymmetric magnitude response or asymmetric time-of-arrival (TOA), said method comprising:
- determining a low-frequency cross-over Fc of the audio speakers;
- tuning an asymmetric FIR filter bank to normalize the magnitude responses of the at least two audio speakers to a target response above the low-frequency cross-over Fc, wherein tuning the asymmetric FIR filter bank comprises:
  - measuring responses for each speaker:
  - determining magnitude responses and relative delays for the audio speakers to the listener position;
  - computing an average magnitude response from the measured magnitude responses;
  - computing FIR filters that invert each magnitude response to the average magnitude response above the low frequency cross-over Fc and clamping the magnitude response to 0 dB below the low-frequency cross-over Fc; and
  - windowing and converting a filter response of each FIR filter to a linear phase FIR filter having a delay equal to a base delay plus a maximum TOA delay less the TOA delay of the transaural audio signal reproduced by the speaker;
- configuring a delay to normalize the TOA of the at least two transaural audio signals at the listener position;
- manually performing a parametric equalization process to configure a symmetric IIR filter bank component to high pass filter above the low frequency cross-over Fc and equalize the normalized magnitude responses of the at least two audio speakers; and
- storing the coefficients for the asymmetric FIR filter bank and the symmetric IIR filter bank component.

18. A method of tuning a gain phase equalization (GPEQ) filter for pre-conditioning at least two transaural audio signals carried in respective audio channels for transaural reproduction at a listener position by an audio device having a like number of audio speakers that exhibit an asymmetric magnitude response or asymmetric time-of-arrival (TOA), said method comprising:
- determining a low-frequency cross-over Fc of the audio speakers;
- tuning an asymmetric FIR filter bank to normalize the magnitude responses of the at least two audio speakers to a target response above the low-frequency cross-over Fc, wherein tuning the asymmetric FIR filter bank comprises:
  - manually tuning asymmetric IIR filters to equalize each speaker magnitude response;
  - computing an aggregate impulse response of all filters for equalizing each speaker magnitude response;
  - windowing the aggregate impulse response to create an FIR filter for each speaker; and
  - converting the FIR filter of each speaker to a linear phase filter having a delay equal to a base delay plus a maximum TOA delay less the TOA delay of the transaural audio signal reproduced by the speaker;

configuring a delay to normalize the TOA of the at least two transaural audio signals at the listener position;

manually performing a parametric equalization process to configure a symmetric IIR filter bank component to high pass filter above the low frequency cross-over Fc and equalize the normalized magnitude responses of the at least two audio speakers; and storing the coefficients for the asymmetric FIR filter bank and the symmetric IIR filter bank component.

19. A method of tuning a gain phase equalization (GPEQ) filter for pre-conditioning at least two transaural audio signals carried in respective audio channels for transaural reproduction at a listener position by an audio device having a like number of audio speakers that exhibit an asymmetric magnitude response or asymmetric time-of-arrival (TOA), said method comprising:

determining a low-frequency cross-over Fc of the audio speakers;

manually adjusting the magnitude response to configure an asymmetric IIR filter bank component to correct residual asymmetry in the magnitude responses of the at least two transaural audio signals near the low-frequency cross-over Fc while preserving the relative phases of the at least two transaural audio signals;

tuning an asymmetric FIR filter bank to normalize the magnitude responses of the at least two audio speakers to a target response above the low-frequency cross-over Fc;

configuring a delay to normalize the TOA of the at least two transaural audio signals at the listener position;

manually performing a parametric equalization process to configure a symmetric IIR filter bank component to high pass filter above the low frequency cross-over Fc and equalize the normalized magnitude responses of the at least two audio speakers; and storing the coefficients for the asymmetric FIR filter bank and the symmetric IIR filter bank component.

20. The method of claim 19, wherein the asymmetric IIR filter bank component comprises phase compensated IIR filters in which each section includes only an EQ filter having the magnitude response and a first modified phase response to equalize one of the transaural audio signals and a balancing filter having an all-pass magnitude response and a phase response to phase balance all of the other transaural audio signals, wherein said EQ filter and said balancing filter are of the same order.

21. The method of claim 20, wherein the modified phase response of the EQ filter is achieved by creating a non-minimum phase equivalent of EQ filter by reciprocating the system zeros to outside the unit circle.

22. The method of claim 20, wherein the balancing filter is created by designing a PEQ filter with 0 dB gain, but the same center frequency as the EQ filter, such that its poles align with the poles of the first EQ filter and reciprocating the system zeros to the outside the unit circle such that the EQ filter and the balancing filter have a relative phase response with negligible difference.

23. The method of claim 19, further comprising providing an N-tap FIR filter bank of which $M<=N$ taps are asymmetrically configured with coefficients for the audio device; and providing an IIR filter bank including X IIR filter sections of which Y sections are symmetrically configured with coefficients for the audio device and Z sections are asymmetrically configured with coefficients for the audio device where $Y+Z<=X$.

* * * * *